(12) United States Patent
Romero

(10) Patent No.: US 7,555,039 B2
(45) Date of Patent: Jun. 30, 2009

(54) SIMULTANEOUS DISPLAY OF EYE DIAGRAM AND JITTER PROFILE DURING DEVICE CHARACTERIZATION

(75) Inventor: Gabriel Romero, Colorado Springs, CO (US)

(73) Assignee: LSI Corporation, Milpitas, CA (US)

(*) Notice: Subject to any disclaimer, the term of this patent is extended or adjusted under 35 U.S.C. 154(b) by 653 days.

(21) Appl. No.: 11/323,935

(22) Filed: Dec. 29, 2005

(65) Prior Publication Data

US 2007/0156360 A1    Jul. 5, 2007

(51) Int. Cl.
  *H04Q 1/20* (2006.01)
  *G01R 13/00* (2006.01)
(52) U.S. Cl. .................. 375/226; 702/69
(58) Field of Classification Search ......... 375/225–228, 375/371, 373; 702/67, 69
See application file for complete search history.

(56) References Cited

U.S. PATENT DOCUMENTS

| | | | |
|---|---|---|---|
| 6,701,269 B1* | 3/2004 | Jungerman et al. | 702/106 |
| 7,295,604 B2* | 11/2007 | Cranford et al. | 375/226 |
| 2006/0069967 A1* | 3/2006 | Almy et al. | 714/724 |

\* cited by examiner

*Primary Examiner*—Young T. Tse
(74) *Attorney, Agent, or Firm*—William W. Cochran; Cochran Freund & Young LLC

(57) ABSTRACT

A system, apparatus and method for testing and optimizing an electrical device using a simultaneous display of both a signal's eye diagram and total jitter profile are described. In one embodiment of the invention, a data capture module capable of obtaining and separating the total jitter present in a signal into deterministic and random jitter, as well as other eye diagram information, is coupled to the electrical device and one or more display devices. These one or more display devices provide a user a simultaneous visual display of both random jitter and an eye diagram. This simultaneous display allows a user to test and optimize the electrical device without having to attach and detach the electrical device to multiple measuring devices.

20 Claims, 5 Drawing Sheets

SIMULTANEOUS DISPLAY OF EYE DIAGRAM AND JITTER PROFILE DURING DEVICE CHARACTERIZATION

BACKGROUND

A. Technical Field

This invention relates generally to electrical device testing and optimization, and more particularly, to the measurement of jitter and the display of an eye diagram during the characterization of an electrical device.

B. Background of the Invention

The importance of electrical device testing and optimization is well known in the art. A number of different technological advancements have improved the performance of communication devices and led to ever-increasing rates at which data may be sent between electrical devices. These advancements have also given rise to a new era of electronic product verification and testing. In particular, the importance of properly measuring signal characteristics, such as a signal-to-noise ratio, jitter, and other signal integrity characteristics, may become even more important as communications systems become increasingly complex.

Electrical components need to be tested and verified in order to ensure that appropriate communication occurs within a system. This component or device characterization ensures proper functioning and compatibility of the devices within a communications system. Device characterization often includes the verification and testing of various signal characteristics including a jitter analysis, timing interval analysis, and eye diagram analysis. This characterization may also include testing the device relative to a simulation of the environment in which the device will operate.

An eye diagram visually presents timing and voltage uncertainty associated with the signal. In particular, an eye diagram is seen by overlaying the multiple edges of the signal across many cycles. Each waveform is overlaid based on a specific reference, usually a clock signal. The thickness of the overlaid signal waveforms represent the timing variations of the signal which is also referred to as jitter.

These variations in signal may in part be attributed to various types of jitter, each of which may be addressed during the characterization procedures, including device testing and optimization. The task of efficiently measuring these different types of jitter, and optimizing the device accordingly, may present difficulties to a test engineer.

The broadest classification of jitter may be described relative to two categories, deterministic jitter and random jitter. Deterministic jitter component comes from the bounded sources such as crosstalk, inter-symbol interference ("ISI"), and power supply feed-through. Since, such a type of jitter is bounded, it is easier to predict and be tested. Comparatively, random jitter is unbounded and much more difficult to characterize. Random jitter may be generated from various sources including thermal noise, shot noise, white noise, etc. and is relatively more difficult to predict. Also, there may exist uncorrelated jitter on a signal, which is caused by non-synchronized noise generated by one or more different clocks within a system.

Deterministic jitter may include a sinusoidal jitter component. To characterize this type of jitter, longer time variations should be observed and used to generate an eye diagram. As described above, the random jitter component may not be easily characterized using an eye diagram. An eye diagram, which tracks some instances of the signal, may fail to catch the random jitter component because only periodic samples of data are collected and the random jitter component may not appear in the eye diagram.

There are devices which enable user to either view random jitter data or an eye diagram. FIG. 1 shows a block diagram representation of a prior art procedure of receiver characterization. An electrical device 102, often referred to a Device Under Test ("DUT"), to be characterized is first connected to an oscilloscope 104 to observe a corresponding eye diagram. As explained above, the eye diagram does not allow efficient monitoring of random jitter component. The eye diagram may be used to determine whether a transmitter, receiver or other device is compliant to a specification; however, it often fails to provide enough information or distinct values for accurate jitter measurements. In particular, the eye diagram provides peak-to-peak measurements and eye opening measures, such as voltage (vertical opening) and timing (horizontal opening).

The electrical device 102 is disconnected from the oscilloscope 104 and connected to a jitter measuring device 106. If the device settings are found not to be optimum during the jitter measuring phase of the device characterization procedure, the whole procedure needs to be repeated by disconnecting the electrical device 102 from the jitter measuring device 106 and reconnected to the oscilloscope 104 with the new settings. This makes the procedure of device characterization cumbersome and error prone since it requires repeatedly attaching and detaching the electrical device 102 to either the oscilloscope 104 or jitter measuring device 106.

SUMMARY OF THE INVENTION

The present invention provides a system, apparatus, and method for electrical device characterization using a simultaneous display of a signal eye diagram and random jitter characteristics. In one embodiment of the invention, a data capture module is provided that obtains signal data relating to random jitter, deterministic jitter, uncorrelated bound jitter and data required to show an eye diagram. Accordingly, the decomposition of the total jitter is characterized and displayed to a user. A display(s) is provided that allows both random jitter characteristics and an eye diagram to be simultaneously shown to a user. The data capture module and/or display may be embodied in a single oscilloscope or be embodied in different display devices.

The present invention provides significant improvements over prior art devices because a user is able to more easily measure random jitter and observe eye diagrams. Furthermore, the user is able to more easily identify relationships between the random jitter measurements and eye diagrams. In one embodiment of the invention, a bit error rate tester ("BERT"), oscilloscope, one or more function generators and a jitter generator are used to test a particular electrical device. A control may be used to change the device settings based on both random jitter and eye opening observations.

Because the invention allows simultaneous observation of an eye diagram and jitter data, the electrical device being tested is not required to be connected and disconnected to and from various jitter measurement devices and oscilloscopes. The control attached to the device being tested may be used to modify device settings relative to real-time displays of random jitter and the eye diagram. Accordingly, the testing procedure becomes relatively more accurate and easier for a user to perform.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. ("FIG.") 1 is a general block diagram illustrating a prior art method of measuring jitter and displaying a signal eye diagram.

DETAILED DESCRIPTION OF THE PREFERRED EMBODIMENTS

A system, apparatus and method for testing and optimizing an electrical device using a simultaneous display of both a signal's eye diagram and total jitter profile are described. In one embodiment of the invention, a data capture module capable of obtaining and separating the total jitter present in a signal into deterministic and random jitter, as well as other eye diagram information, is coupled to the electrical device and one or more display devices. These one or more display devices provide a user a simultaneous visual display of both random jitter and an eye diagram. This simultaneous display allows a user to test and optimize the electrical device without having to attach and detach the electrical device to multiple measuring devices. In one embodiment, the invention may be particularly applied to the characterization or simulation of a signal at a receiver.

In one embodiment of the invention, both the data capture module and the display(s) are integrated within an oscilloscope. In another embodiment, a display of the random jitter and/or eye diagram may be provided to a user on a computer screen.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different computing systems and devices, including an oscilloscope. The embodiments of the present invention may be present in hardware, software or firmware. Structures and devices shown below in block diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

Figure 1:
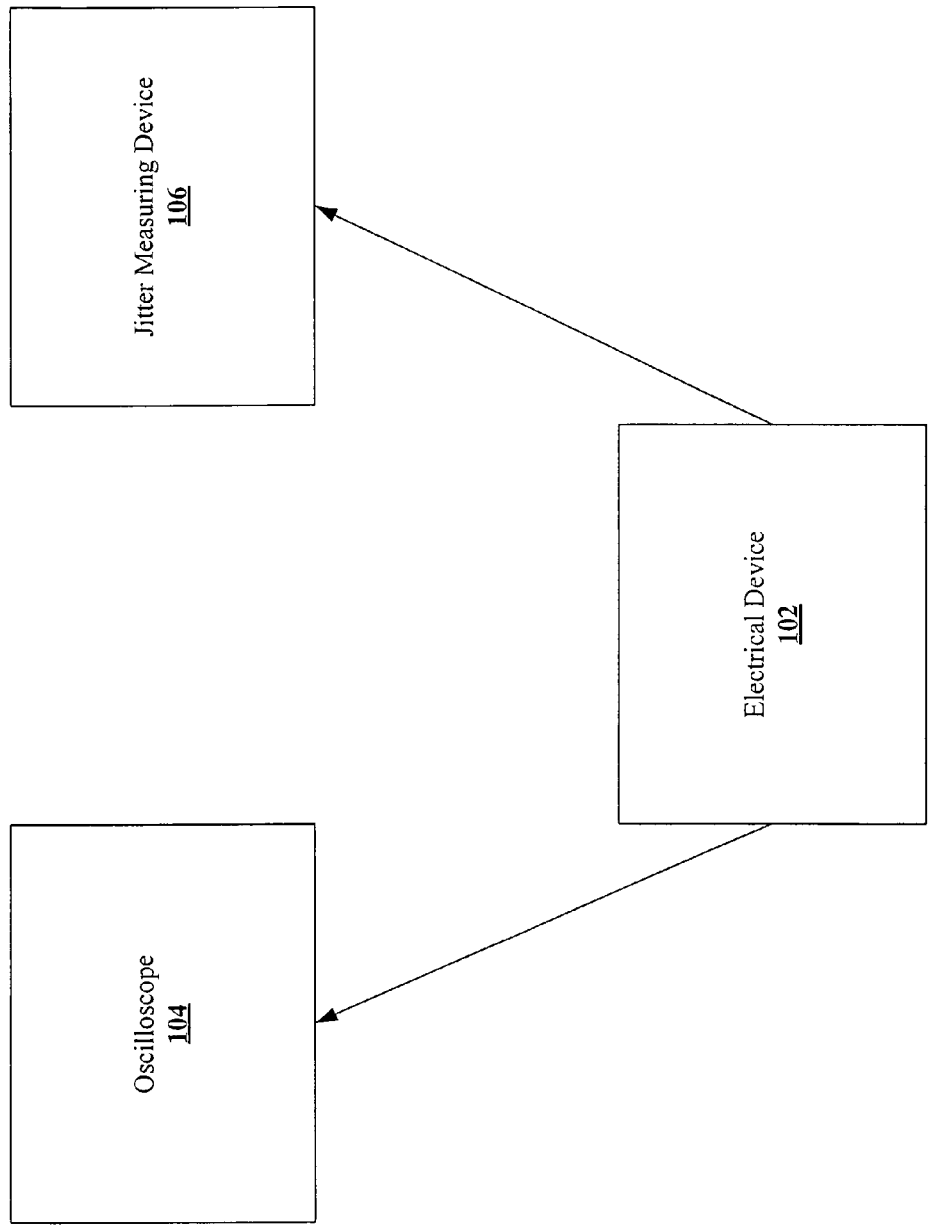
Figure 2:
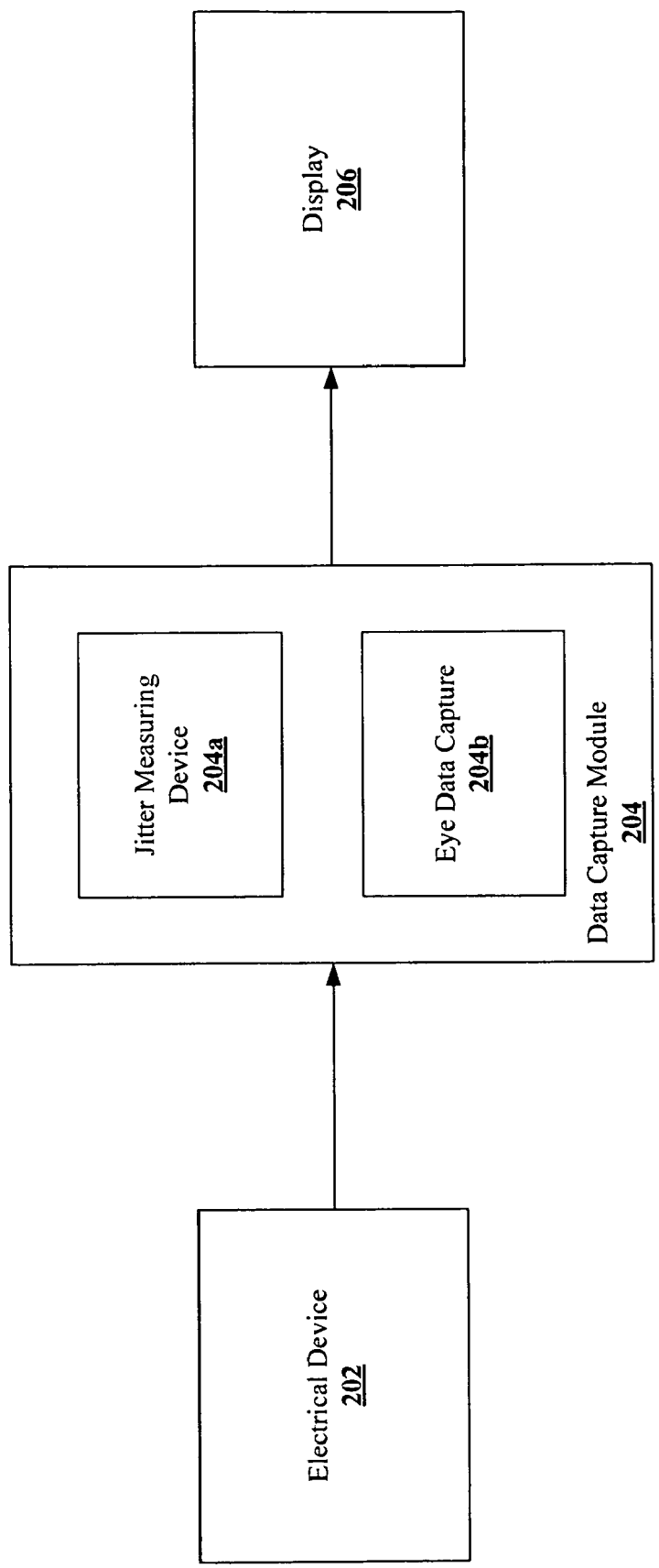
FIG. 2 illustrates a block diagram of a system for simultaneously displaying signal jitter information and an eye diagram according to one embodiment of the invention.

FIG. 2 illustrates a general block diagram of a system to simultaneously display jitter profile, including deterministic jitter, random jitter and uncorrelated deterministic jitter, and an eye diagram according to one embodiment of the invention. A data capture module 204 is provided that obtains jitter information, including both deterministic and random jitter, and other data that may be necessary to display a signal's eye diagram. The data capture module 204 comprises a jitter measuring device 204a and an eye data capture 204b. The data captured by the data capture module 204 is passed on to a display 206 where both the eye diagram and random jitter characteristics are displayed.

An electrical device 202 may be coupled to the data capture module 204 so that an eye diagram and jitter profile associated with the electrical device 202 may be displayed. Various intermediary components may be coupled between the electronic device 202 and the data capture module 204. Both receive and transmit characteristics of the electrical device 202 may be tested and modified using various embodiments of the invention.

Figure 3:
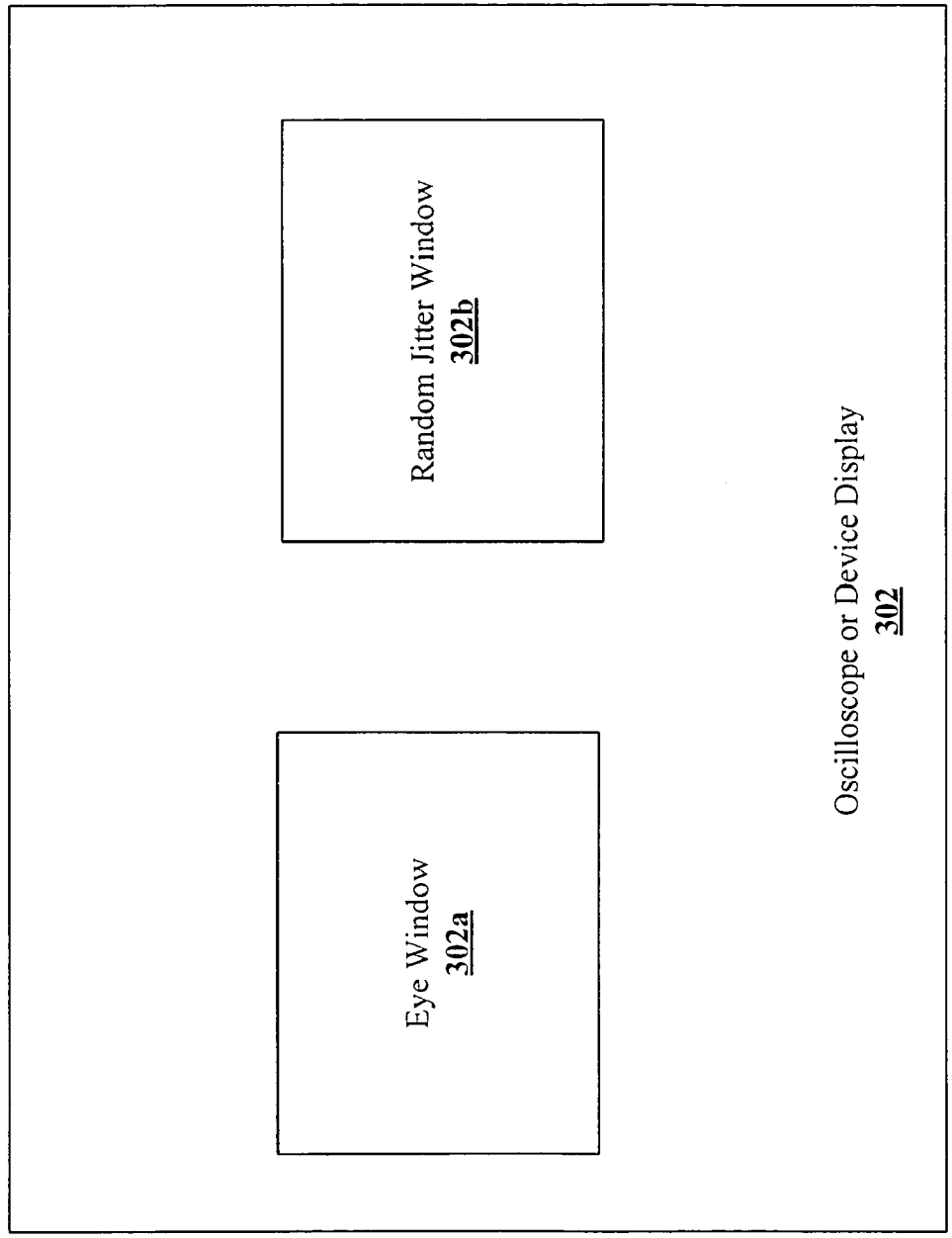
FIG. 3 illustrates an exemplary display window for simultaneously showing an eye diagram and jitter data according to one embodiment of the invention.

FIG. 3 is a block diagram illustrating a display in which two windows are provided to show an eye diagram and the jitter profile. The display 302 may be integrated within an oscilloscope, a computer monitor or other device, and combinations thereof. In one embodiment of the invention, a first window 302a is provided to displays a signal's eye diagram and a second window 302b is provided that displays the signal's jitter characteristics, including random jitter. In the eye window 302a, the displayed eye diagram is useful in determining signal characteristics, including the signal's peak-to-peak measurements, voltage and timing characteristics. A template may be applied to the eye window 302a to identify whether a signal's eye diagram falls within a particular specification, standard or protocol. Comparatively, the jitter window 302b provides more complete information describing the signal's jitter characteristics including information about random jitter because instantaneous or real-time data is shown. Using the combination of the eye window 302a and the jitter window 302b, an individual may optimize a signal's jitter characteristics while ensuring that the eye diagram stays within a particular specification. In another embodiment (not shown), both the eye diagram and jitter characteristics may be provided to a user in a single window.

B. Device Testing and Optimization

Figure 4:
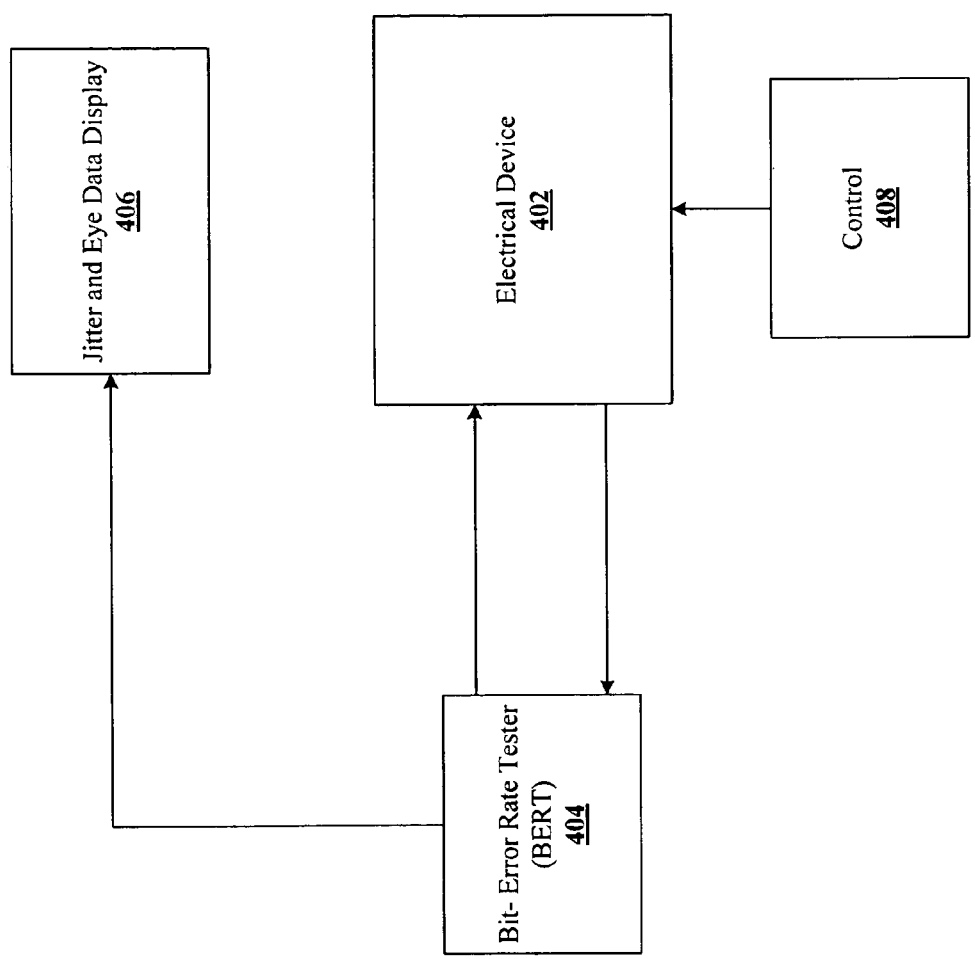
FIG. 4 shows a general block diagram of a system for optimizing an electrical device based on simultaneous eye diagram and jitter data display according to one embodiment of the invention.

FIG. 4 illustrates a system in which an electrical device may be tested and optimized using a simultaneous display of an eye diagram and total jitter profile, including deterministic jitter, random jitter and uncorrelated deterministic jitter. As illustrated, an electrical device 402 is coupled to a bit error rate tester ("BERT") 404 that generates and receives a stream of test data. The BERT 404 is also coupled to a jitter and eye diagram display 406 that shows both jitter characteristics and an eye diagram associated with the electrical device 402 to a user. A control 408 may be used to adjust settings on the electrical device 402 and/or testing equipment (e.g., jitter generator) based on the simultaneously displayed random jitter characteristics and eye diagram. For example, the amount of jitter from a jitter generator may be adjusted to see the response of the eye diagram and jitter characteristics.

Additionally, the settings on a receiver may be adjusted to optimize the receiver performance relative to the simultaneously displayed jitter characteristics and eye diagram.

The BERT 404 calculates an associated bit error rate of the electrical device 402 by sending a test stream of data to the electrical device 402 and analyzing a return stream. In one embodiment of the invention, both deterministic and random jitter are added to the test stream of data prior to being processed by the electrical device 402. After being processed by the electrical device 402, the returning stream of data from the electrical device 402 to the BERT 404 is compared to the test stream of data to identify errors. Using the number of erroneously received bits, the BERT 404 calculates a bit error rate. Erroneous bits, and other signal characteristic information, may be seen in either or both of the eye diagram and jitter information that are simultaneously displayed on the display 406.

In response to the eye diagram and jitter information, a user may optimize the electrical device 402 using the control 408. This optimization process may include the changing of device settings based on a series of observed results on the jitter and eye data display 406. For example, certain settings of the device may lead to the changes in deterministic jitter which may be observed within the display 406. Additionally, random jitter characteristics may also be observed within the display and the electrical device 402 settings may be modified accordingly. Furthermore, the testing equipment may be adjusted to see the electrical device 402 response to such changes. This adjustment of device settings allows a user to see the real-time effects of modified settings on the signal's eye diagram and random jitter characteristics.

A cycle of monitoring device characteristics associated with new settings on the device 402 or testing equipment, and adjusting the settings may be continually repeated until a preferred result is achieved. The device and testing equipment settings can thus be changed dynamically without requiring reconnection and disconnection of device to and from different devices.

Oftentimes during testing a device, the environment in which the device is to operate will be simulated. This simulation may include the generation of a data stream on which simulated jitter is added. The simulated jitter may include both a deterministic and random jitter component, which may be provided by a combination of a function generator(s) and a random jitter generator.

Figure 5:
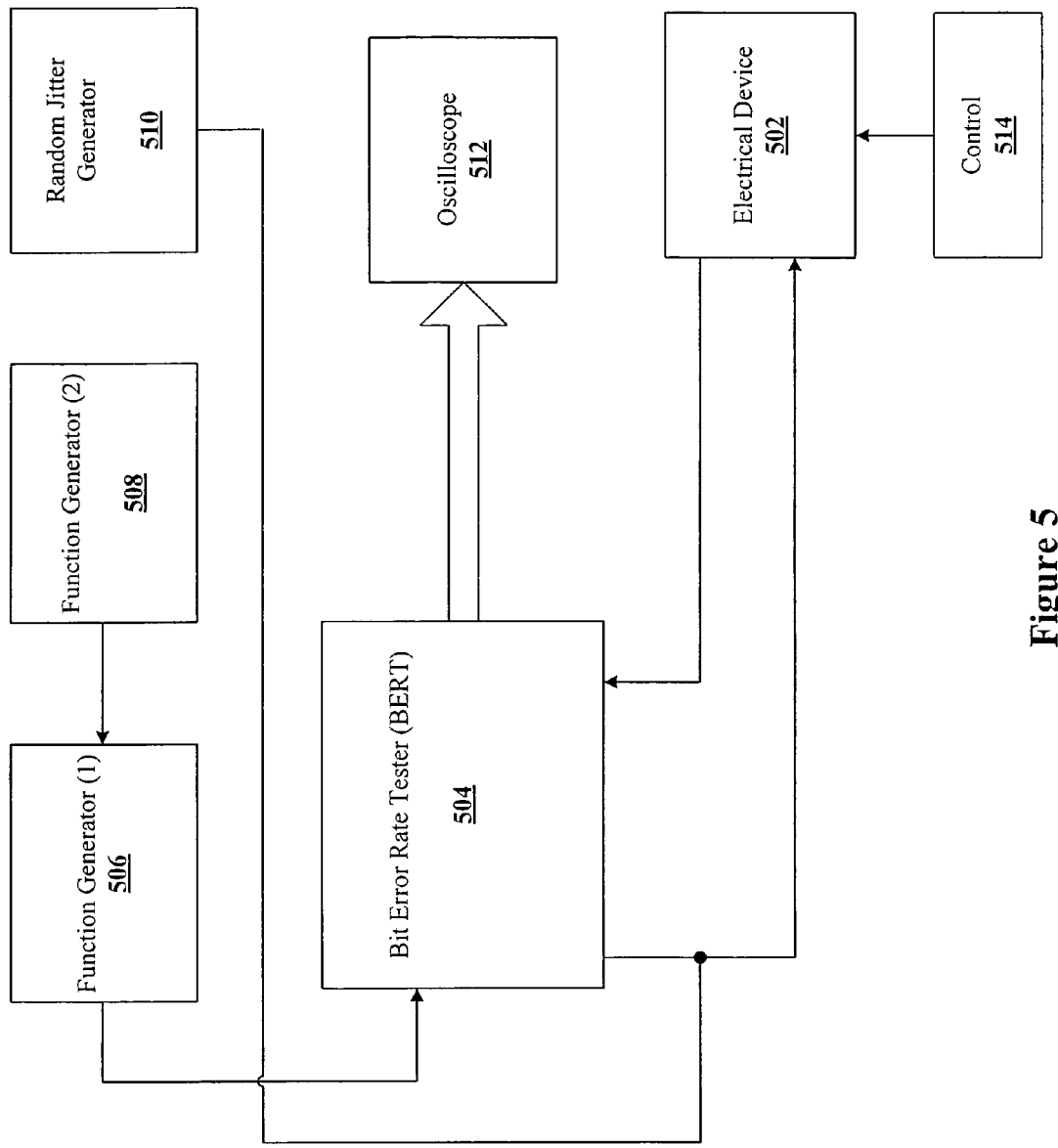
FIG. 5 shows a detailed block diagram of a system for optimizing an electrical device based on simultaneous eye diagram and jitter data display according to one embodiment of the invention.

FIG. 5 illustrates an exemplary system in which an electrical device may be tested and optimized. In one embodiment of the invention, an electrical device 502 is coupled to receive and transmit data to a BERT 504. The BERT 504 is coupled to receive a clock from a first function generator 506, which is coupled to a second function generator 508. The first function generator 506 is used to produce a stream of bits comprising a clock. The second function generator 508 is connected to first function generator 506 to modulate the clock. In one embodiment of the invention, the modulation of the clock is done to include sinusoidal variations of the signal, which in part represents the deterministic jitter component of the total jitter. In other embodiments, the clock may be provided solely by the first function generator 506 and deterministic generated locally within the first function generator 506.

A random jitter generator 510 is coupled to add random jitter to a first data stream that is being transmitted from the BERT 504 to the electrical device 502. This random jitter may be added to the first data stream using a device such as a power splitter. Accordingly, the first data stream has both deterministic and random jitter components that are used to test and optimize the electrical device 502.

The BERT 504 is coupled to receive a second data stream from the electrical device 502 from which errors are identified and a bit error rate is calculated. This bit error rate includes both deterministic and non-deterministic (random) jitter components, which allows a more accurate characterization and optimization of the electrical device 502.

The BERT 504 is connected to one or more display devices in which signal characteristics may be displayed. In one embodiment, the BERT 504 is connected to an oscilloscope 512 on which both jitter components and an eye diagram may be displayed. The display at the oscilloscope 512 may be used to display various data and diagrams as observed. Furthermore, a computer screen or other display may be used to supplement the oscilloscope 512 or be used to replace the oscilloscope 512.

A control 514 may be provided that is used to adjust settings on the electrical device 502 or equipment being used to test the device 502. A user may observe various signal characteristics on the oscilloscope 512 or other display device and modify the settings of the electrical device 502 and test equipment accordingly. Thus, a user is able to observe the response of the electrical device 502 to changed settings relative to both deterministic and non-deterministic jitter.

In an exemplary test method for testing and optimizing the receiver characteristics of the electrical device 502, deterministic jitter is provided on a clock used to drive the BERT 504. The BERT 504 creates a first data stream, having the deterministic jitter, and transmits the first data stream to the electrical device 502. Random jitter is added to the first data stream by the random jitter generator 510 prior to reception at the electrical device 502.

The electrical device 502 receives the first data stream and samples the first data stream. Based on the sampled first data stream, the electrical device 502 generates and transmits a second data stream to the BERT 504. The second data stream is compared to the first data stream to identify errors caused by both jitter components on the first data stream. Thereafter, the BERT 504 is able to provide information describing the characteristics of the electrical device 502 relative to deterministic and non-deterministic jitter.

A user may adjust the settings of the electrical device 502 or test equipment, using the control 514, to enable the electrical device to more effectively compensate for either or both types of jitter. The display device, such as the oscilloscope 512, may display jitter and an eye diagram within a single window or multiple windows. The process may be started again to test the electrical device with the new settings.

While the present invention has been described with reference to certain exemplary embodiments, those skilled in the art will recognize that various modifications may be provided. Accordingly, the scope of the invention is to be limited only by the following claims.

What is claimed is:

1. A method for testing an electrical device comprising:
generating a first data stream in which deterministic and random jitter components are present;
processing the first data stream at the electrical device;
providing a second data stream in which a plurality of errors were generated during the processing of the first data stream and caused by the deterministic and random jitter components; and
simultaneously displaying information describing errors caused by the random jitter component in the first data stream and an eye diagram of the second data stream.

2. The method of claim 1 wherein the deterministic jitter component is added to the first data stream using at least one function generator to create a clock.

3. The method of claim 2 wherein the at least one function generator creates the clock having sinusoidal variations.

4. The method of claim 1 wherein the random jitter component is added to the first data stream using a random jitter generator and power splitter.

5. The method of claim 1 wherein the electrical device is a receiver that samples the first data stream and generates the second data stream based on the sampling.

6. The method of claim 1 wherein the information describing errors caused by the random jitter component in the first data stream and the eye diagram of the second data stream are simultaneously displayed on an oscilloscope.

7. The method of claim 1 wherein the eye diagram of the second data stream is displayed on an oscilloscope and the information describing errors caused by the random jitter component is displayed on a computer screen.

8. The method of claim 1 further comprising the step of adjusting at least one setting on the electrical device in response to the simultaneously displayed information describing errors caused by the random jitter component in the first data stream and the eye diagram of the second data stream.

9. The method of claim 8 wherein the at least one setting is automatically adjusted until the information describing errors caused by the random jitter component in the first data stream and the eye diagram of the second data stream fall within a preferred range.

10. The method of claim 1 further comprising the step of adjusting at least one setting on equipment used to test the electrical device and simultaneously displaying a jitter component of the random jitter component or the deterministic jitter component in the first data stream, and the eye diagram of the second stream associated with an adjusted test equipment.

11. A system for simulating jitter and testing an electrical device relative to the simulated jitter, the system comprising:
   a bit error rate tester, coupled to transmit a first data stream to the electrical device and receive a second data stream from the electrical device, having data capture module that captures information related to to deterministic jitter and random jitter;
   a first function generator, coupled to the bit error rate tester and add a deterministic jitter component to the first data stream, that generates a clock associated with the first data stream;
   a random jitter generator, coupled to add a random jitter component to the first data stream, that generates a random jitter signal; and
   a display, coupled to the bit error rate tester, that simultaneously displays information describing random jitter characteristics of the electrical device and an eye diagram of the second data stream.

12. The system of claim 11 further comprising a second function generator, coupled to the first function generator, that generates sinusoidal variations on the clock from the first function generator.

13. The system of claim 11 wherein the display comprises an oscilloscope.

14. The system of claim 11 further comprises a control, coupled to the electrical device, that adjusts at least one setting on the electrical device in response to the simultaneously displayed information describing random jitter characteristics of the electrical device and the eye diagram of the second data stream.

15. The system of claim 14 wherein a user manually adjusts the at least one setting in response to viewing the simultaneously displayed information describing random jitter characteristics of the electrical device and the eye diagram of the second data stream.

16. The system of claim 11 wherein the random jitter component is added to the first data stream using a power coupler.

17. A computer program product embodied on a computer readable medium for simultaneously displaying deterministic jitter information and random jitter information associated with an electrical device, the computer program product comprising computer instructions for:
   generating a first data stream in which deterministic and random jitter components are present;
   processing the first data stream at the electrical device;
   providing a second data stream in which a plurality of errors were generated during the processing of the first data stream and caused by the deterministic random jitter components; and
   simultaneously displaying information describing errors caused by the random jitter component in the first data stream and an eye diagram of the second data stream.

18. The computer program product of claim 17 further comprising computer instructions for adjusting at least one setting on the electrical device in response to the simultaneously displayed information describing errors caused by the random jitter component in the first data stream and the eye diagram of the second data stream.

19. The computer program product of claim 18 wherein a user manually adjusts the at least one setting in response to viewing the simultaneously displayed information describing errors caused by the random jitter component in the first data stream and the eye diagram of the second data stream.

20. The computer program product of claim 17 wherein the eye diagram of the second data stream is displayed on an oscilloscope.

* * * * *